(12) United States Patent
Wang et al.

(10) Patent No.: US 6,951,707 B2
(45) Date of Patent: Oct. 4, 2005

(54) PROCESS FOR CREATING VIAS FOR CIRCUIT ASSEMBLIES

(75) Inventors: Alan E. Wang, Gibsonia, PA (US); Kevin C. Olson, Wexford, PA (US)

(73) Assignee: PPG Industries Ohio, Inc., Cleveland, OH (US)

( * ) Notice: Subject to any disclaimer, the term of this patent is extended or adjusted under 35 U.S.C. 154(b) by 320 days.

(21) Appl. No.: 10/184,387

(22) Filed: Jun. 27, 2002

(65) Prior Publication Data

US 2004/0000427 A1 Jan. 1, 2004

Related U.S. Application Data

(63) Continuation-in-part of application No. 09/901,373, filed on Jul. 9, 2001, now Pat. No. 6,671,950, and a continuation-in-part of application No. 09/851,904, filed on May 9, 2001, now abandoned, and a continuation-in-part of application No. 09/802,001, filed on Mar. 8, 2001, now abandoned.

(51) Int. Cl.$^7$ ............................................... G03F 7/00
(52) U.S. Cl. ..................................... 430/313; 430/330
(58) Field of Search ................................. 430/311, 313, 430/317, 330; 216/41

(56) References Cited

U.S. PATENT DOCUMENTS

| | | | |
|---|---|---|---|
| 3,455,806 A | 7/1969 | Spoor et al. | 204/181 |
| 3,469,982 A | 9/1969 | Celeste | 96/35.1 |
| 3,663,389 A | 5/1972 | Koral et al. | 204/181 |
| 3,738,835 A | 6/1973 | Bakos | 96/36 |
| 3,749,657 A | 7/1973 | Le Bras et al. | 204/181 |
| 3,793,278 A | 2/1974 | Bona | 260/29.2 EP |
| 3,833,436 A | 9/1974 | Hillis et al. | 156/13 |
| 3,928,157 A | 12/1975 | Suematsu et al. | 204/181 |
| 3,947,338 A | 3/1976 | Jerabek et al. | 204/181 |
| 3,947,339 A | 3/1976 | Jerabek et al. | 204/181 |
| 3,962,165 A | 6/1976 | Bosso et al. | 260/29.2 EP |
| 3,975,345 A | 8/1976 | Fessler | 260/29.2 N |
| 3,984,299 A | 10/1976 | Jerabek | 204/181 |
| 4,001,101 A | 1/1977 | Bosso et al. | 204/181 |
| 4,116,900 A | 9/1978 | Belanger | 260/18 |
| 4,134,932 A | 1/1979 | Kempter et al. | 260/181 |
| 4,321,290 A | 3/1982 | Thams | 427/289 |
| 4,332,711 A | 6/1982 | Kooymans et al. | 523/402 |
| 4,343,885 A | 8/1982 | Reardon, Jr. | 430/177 |
| 4,352,842 A | 10/1982 | Kooymans et al. | 427/385.5 |
| 4,378,264 A | 3/1983 | Pilette et al. | 156/238 |
| 4,419,467 A | 12/1983 | Wismer et al. | 523/414 |
| 4,435,559 A | 3/1984 | Valko | 528/73 |
| 4,436,583 A | 3/1984 | Saiki et al. | 156/659.1 |
| 4,495,229 A | 1/1985 | Wolf et al. | 427/388.2 |
| 4,508,749 A | 4/1985 | Brannon et al. | 427/43.1 |
| 4,592,816 A | 6/1986 | Emmons et al. | 204/180 |
| 4,601,916 A | 7/1986 | Arachtingi | 427/97 |
| 4,714,516 A | 12/1987 | Eichelberger et al. | 156/628 |
| 5,096,556 A | 3/1992 | Corrigan et al. | 204/181.7 |
| 5,153,986 A | 10/1992 | Brauer et al. | 29/846 |
| 5,188,716 A | 2/1993 | Schwerzel et al. | 204/181.7 |
| 5,224,265 A | 7/1993 | Dux et al. | 29/852 |
| 5,227,008 A | 7/1993 | Klun et al. | 156/630 |
| 5,232,548 A | 8/1993 | Ehrenberg et al. | 156/630 |
| 5,242,713 A | 9/1993 | Viehbeck et al. | 427/304 |
| 5,250,164 A | 10/1993 | Valko | 204/181.7 |
| 5,291,066 A | 3/1994 | Neugebauer et al. | 257/750 |
| 5,316,787 A | 5/1994 | Frankeny et al. | 427/97 |
| 5,319,158 A | 6/1994 | Lee et al. | 174/250 |
| 5,590,460 A | 1/1997 | DiStefano et al. | 29/830 |
| 5,600,035 A | 2/1997 | Kahle, II et al. | 568/932 |
| 5,879,808 A | 3/1999 | Wary et al. | 428/411.1 |
| 6,080,526 A * | 6/2000 | Yang et al. | 430/296 |
| 6,107,003 A | 8/2000 | Kuwako | 430/314 |
| 6,130,148 A | 10/2000 | Farnworth et al. | 438/613 |
| 6,130,149 A | 10/2000 | Chien et al. | 438/613 |
| 6,150,284 A | 11/2000 | Kawahara | 438/780 |
| 6,165,338 A | 12/2000 | December et al. | 204/506 |
| 6,266,874 B1 | 7/2001 | DiStefano et al. | 29/846 |
| 6,333,555 B1 | 12/2001 | Farnworth et al. | 257/737 |
| 2002/0004982 A1 | 1/2002 | Haze et al. | 29/852 |

FOREIGN PATENT DOCUMENTS

| | | |
|---|---|---|
| DE | 2707405 | 1/1978 |
| EP | 0012463 | 6/1982 |
| EP | 0272500 | 6/1988 |
| EP | 0272500 | 5/1993 |
| EP | 0573053 | 12/1993 |
| WO | WO 98/20559 | 5/1998 |
| WO | WO01/77753 | 10/2001 |

OTHER PUBLICATIONS

PARYLENE: A Protective Conformal Coating for Hybrid Circuits, Speedline Technologies (2000).
SCS Parylene Specifications and Properties product literature, Speedline Technologies (2000).
Encyclopedia of Chemical Technology, Fourth Edition, Supplement Volume, p. 863–901 (1998).
*Polymers for Microelectronics*, Persented at the 203$^{rd}$ National Meeting of American Chemical Society, Apr., 1992, Chapter 35, pp. 507–508, by Larry F. Thompson et al.
*Handbook of Flexible Circuits*, p. 242, 1991 by Ken Gilleo.
*Handbook of Polymer Coatings for Electronics*, pp. 114–118, 2$^{nd}$ Edition, by James J. Licari et al.
IPC–TM–650 Test Methods Manual, No. 2.3.10, Flammability of Laminates 12/94, pp. 1–3.

* cited by examiner

*Primary Examiner*—Kathleen Duda
(74) *Attorney, Agent, or Firm*—Deborah M. Altman

(57) ABSTRACT

Provided is a process for creating vias for a circuit assembly including the steps of (a) applying a curable coating composition to a substrate, some or all of which is electrically conductive, to form an uncured coating thereon; (b) applying a resist over the uncured coating; (c) imaging the resist in predetermined locations; (d) developing the resist to expose predetermined areas of the uncured coating; (e) removing the exposed areas of the uncured coating; and (f heating the coated substrate of step (e) to a temperature and for a time sufficient to cure the coating. Also disclosed is a process of fabricating a circuit assembly.

57 Claims, No Drawings

PROCESS FOR CREATING VIAS FOR CIRCUIT ASSEMBLIES

CROSS-REFERENCE TO RELATED APPLICATIONS

This application is a Continuation-In-Part of U.S. patent application Ser. No. 09/802,001 filed Mar. 8, 2001 now abandoned; U.S. patent application Ser. No. 09/851,904 filed May 9, 2001 now abandoned; and U.S. patent application Ser. No. 09/901,373, filed Jul. 9, 2001 now U.S. Pat. No. 6,671,950, each of which is incorporated in its entirety herein by reference. Also, this application is related to U.S. patent application Ser. No. 10/184,195; U.S. patent application Ser. No. 10/184,192; and U.S. patent application Ser. No. 10/183,674, all filed concurrently herewith.

FIELD OF THE INVENTION

The present invention relates to processes for creating vias and for fabricating multi-layer electrical circuit assemblies.

BACKGROUND OF THE INVENTION

Electrical components, for example, resistors, transistors, and capacitors, are commonly mounted on circuit panel structures such as printed circuit boards. Circuit panels ordinarily include a generally flat sheet of dielectric material with electrical conductors disposed on a major, flat surface of the sheet, or on both major surfaces. The conductors are commonly formed from metallic materials such as copper and serve to interconnect the electrical components mounted to the board. Where the conductors are disposed on both major surfaces of the panel, the panel may have via conductors extending through holes (or "through vias") in the dielectric layer so as to interconnect the conductors on opposite surfaces. Multi-layer circuit panel assemblies have been made heretofore which incorporate multiple stacked circuit panels with additional layers of dielectric materials separating the conductors on mutually facing surfaces of adjacent panels in the stack. These multi-layer assemblies ordinarily incorporate interconnections extending between the conductors on the various circuit panels in the stack as necessary to provide the required electrical interconnections.

In microelectronic circuit packages, circuits and units are prepared in packaging levels of increasing scale. Generally, the smallest scale packaging levels are typically semiconductor chips housing multiple microcircuits and/or other components. Such chips are usually made from ceramics, silicon, and the like. Intermediate package levels (i.e., "chip carriers") comprising multi-layer substrates may have attached thereto a plurality of small-scale chips housing many microelectronic circuits. Likewise, these intermediate package levels themselves can be attached to larger scale circuit cards, motherboards, and the like. The intermediate package levels serve several purposes in the overall circuit assembly including structural support, transitional integration of the smaller scale microcircuits and circuits to larger scale boards, and the dissipation of heat from the circuit assembly. Substrates used in conventional intermediate package levels have included a variety of materials, for example, ceramic, fiberglass reinforced polyepoxides, and polyimides.

The aforementioned substrates, while offering sufficient rigidity to provide structural support to the circuit assembly, typically have thermal coefficients of expansion much different than that of the microelectronic chips being attached thereto. As a result, failure of the circuit assembly after repeated use is a risk due to failure of adhesive joints between the layers of the assembly.

Likewise, dielectric materials used on the substrates must meet several requirements, including conformality, flame resistance, and compatible thermal expansion properties. Conventional dielectric materials include, for example, polyimides, polyepoxides, phenolics, and fluorocarbons. These polymeric dielectrics typically have thermal coefficients of expansion much higher than that of the adjacent layers.

There has been an increasing need for circuit panel structures, which provide high density, complex interconnections. Such a need can be addressed by multi-layer circuit panel structures; however, the fabrication of such multi-layer circuit assemblies has presented serious drawbacks. A common difficulty in manufacture is the alignment of holes and vias by drilling of the dielectric layers as increasing layers of circuitry are applied. Laser drilling is the most common method for forming vias, which can add significant cost to the manufacture of such circuit assemblies.

Generally multi-layer panels are made by providing individual, dual sided circuit panels with appropriate conductors thereon. The panels are then laminated one atop the other with one or more layers of uncured or partially cured dielectric material, commonly referred to as "prepregs" disposed between each pair of adjacent panels. Such a stack ordinarily is cured under heat and pressure to form a unitary mass. After curing, holes typically are drilled through the stack at locations where electrical connections between different boards are desired. The resulting holes or "through vias" are then coated or filled with electrically conductive materials usually by plating the interiors of the holes to form a plated through via. It is difficult to drill holes with a high ratio of depth to diameter, thus the holes used in such assemblies must be relatively large and consume a great deal of space in the assembly.

In applications wherein circuit layers are built one on top of another, a dielectric material typically separates the circuitized layers. Polymeric dielectric materials that typically are used in circuit assembly manufacture are thermoplastic or thermoset polymers. Thermoset materials are typically cured first to form a conformal coating. Although the conformally coated substrate may contain through holes conforming to a perforate substrate, blind vias are typically formed by drilling, such as by a laser.

U.S. Pat. No. 6,266,874 B1 discloses of method of making a microelectronic component by providing a conductive substrate or "core"; providing a resist at selected locations on the conductive core; and electrophoretically depositing an uncured dielectric material on the conductive core except at locations covered by the resist. The reference suggests that the electrophoretically deposited material can be a cationic acrylic- or cationic epoxy-based composition as those known in the art and commercially available. The electrophoretically deposited material then is cured to form a conformal dielectric layer, and the resist is removed so that the dielectric layer has openings extending to the conductive core at locations that had been covered by the resist. The holes thus formed and extending to the coated substrate or "core" are commonly referred to as "blind vias". In one embodiment, the structural conductive element is a metal sheet containing continuous through holes or "through vias" extending from one major surface to the opposite major surface. When the dielectric material is applied electrophoretically, the dielectric material is deposited at a uniform thickness onto the conductive element surface and the hole walls. It has been found, however, that the electrophoretically deposited dielectric materials suggested by this reference can be flammable, and thus do not meet typical flame retardancy requirements. In addition, the method cannot be utilized on subsequent circuitized layers.

U.S. Pat. Nos. 5,224,265 and 5,232,548 disclose methods of fabricating multi-layer thin-film wiring structures for use in circuit assemblies. The dielectric applied to the core substrate preferably is a fully cured and annealed thermoplastic polymer such as polytetrafluoroethylene, polysulfone, or polyimide-siloxane, preferably applied by lamination.

U.S. Pat. No. 5,153,986 discloses a method of fabricating metal core layers for a multi-layer circuit board. Suitable dielectrics include thermally processable vapor-depositable conformal polymeric coatings. The method uses perforate metal cores providing coated through holes, however the thermally processable polymers are cured before laser drilling to form blind vias.

European Publication No. EP 0 573 053 describes a photocurable and thermosetting coating composition and a method for formation of a solder resist pattern using the composition. The water soluble composition comprises and epoxy resin comprising tertiary amine groups solubilized with a carboxylic acid, as well as photoreactive ethylenically unsaturated groups. The composition is applied to a printed circuit board and dried, thus reacting the solubilizing carboxylic acid with part of the epoxy groups. The coating is then exposed to actinic radiation through a photomask. Exposed portions are rendered insoluble and the remaining coating is dissolved away by dilute acid solution. The remaining pattern is then thermally cured, thus reacting the amine with the remaining epoxy groups. This method, however, is limited to a very specific group of amine-functional epoxy polymers.

U.S. Published Patent Application No. US 2002/0004982 A1 describes a method for forming blind vias without producing "haloing" in the underlying conductive layer. The method comprises applying an insulating layer onto one major surface of a substrate, providing holes in the insulating layer to the substrate, and then thermally curing the insulating layer. Holes are formed by either photo-etching or laser drilling. After the heat oxidized metal is reduced, the process is repeated on the other major surface. In the production of multi-layered double sided wiring boards, production efficiency is critical to be competitive in the marketplace. Sequential treatment of the major surfaces effectively doubles the number of steps in production, thereby reducing efficiency and yield.

Circuitization of intermediate package levels is conventionally performed by applying a positive- or negative-acting photoresist (hereinafter collectively referred to as "resist") to the metallized substrate, followed by exposure, development, etching, and stripping to yield a desired circuit pattern. Resist compositions typically are applied, for example, by laminating, spin coating, electrodeposition, roll coating, screen printing, curtain or immersion techniques. The resist layer thus applied can have a thickness of 5 to 50 microns.

In addition to the substrates previously mentioned, conventional substrates for intermediate package levels can further include solid metal sheets such as those disclosed in U.S. Pat. No. 5,153,986. These solid structures must be perforated during fabrication of the circuit assembly to provide through vias for alignment purposes.

In view of the prior art processes, there remains a need in the art for multi-layer circuit panel structures which provide high density and complex interconnections, the fabrication of which overcomes the drawbacks of the prior art circuit assemblies.

SUMMARY OF THE INVENTION

In one embodiment, the present invention is directed to a process for exposing predetermined areas of a substrate. The process comprises the steps of: (a) applying a curable coating composition to a substrate, some or all of which is electrically conductive, to form an uncured coating thereon; (b) applying a resist over the uncured coating; (c) imaging the resist in predetermined locations; (d) developing the resist to expose predetermined areas of the uncured coating; (e) removing the exposed areas of the uncured coating; and (f) heating the coated substrate of step (e) to a temperature and for a time sufficient to cure the coating.

In another embodiment, the invention is directed toward a process for fabricating a multi-layer electrical circuit assembly comprising the steps of: (a) applying a curable coating composition to a substrate, some or all of which is electrically conductive, to form an uncured coating thereon; (b) applying a resist over the uncured coating; (c) imaging the resist in predetermined locations; (d) developing the resist to expose predetermined areas of the uncured coating; (e) removing the exposed areas of the uncured coating to form a via; (f) heating the coated substrate of step (e) to a temperature and for a time sufficient to cure the coating; (g) stripping the remaining resist; (h) applying a layer of metal to all surfaces; (i) applying a second resist to the layer of metal applied in step (h); 0) processing the second resist to form a predetermined pattern of exposed underlying metal; (k) etching the exposed metal; (l) stripping the remaining second resist; and (m) optionally, repeating steps (a) through (l) one or more times to form multiple layers of interconnecting electrical circuit patterns.

The present invention is further directed to a coated substrate and circuit assembly prepared by the respective aforementioned processes.

DETAILED DESCRIPTION OF THE INVENTION

Other than in the operating examples, or where otherwise indicated, all numbers expressing quantities of ingredients, reaction conditions and so forth used in the specification and claims are to be understood as being modified in all instances by the term "about." Accordingly, unless indicated to the contrary, the numerical parameters set forth in the following specification and attached claims are approximations that may vary depending upon the desired properties sought to be obtained by the present invention. At the very least, and not as an attempt to limit the application of the doctrine of equivalents to the scope of the claims, each numerical parameter should at least be construed in light of the number of reported significant digits and by applying ordinary rounding techniques.

Notwithstanding that the numerical ranges and parameters setting forth the broad scope of the invention are approximations, the numerical values set forth in the specific examples are reported as precisely as possible. Any numerical values, however, inherently contain certain errors necessarily resulting from the standard deviation found in their respective testing measurements.

Also, it should be understood that any numerical range recited herein is intended to include all sub-ranges subsumed therein. For example, a range of "1 to 10" is intended to include all sub-ranges between and including the recited minimum value of 1 and the recited maximum value of 10, that is, having a minimum value equal to or greater than 1 and a maximum value of equal to or less than 10.

As previously mentioned, in one embodiment, the present invention is directed to a process for exposing predetermined areas of a substrate. The process comprises the steps of: (a) applying a curable coating composition to a substrate, some or all of which is electrically conductive, to form an uncured coating thereon; (b) applying a resist over the uncured coating; (c) imaging the resist in predetermined locations; (d) developing the resist to expose predetermined areas of the uncured coating; (e) removing the exposed areas of the uncured coating; and (f) heating the coated substrate of step (e) to a temperature and for a time sufficient to cure the coating. Optionally, the process further comprises step (g) stripping the remaining resist.

The substrate or core can comprise a variety of substrates, provided that at least part of the substrate is electrically conductive. In one embodiment, the substrate can be an electrically conductive substrate, particularly a metal substrate, for example, untreated or galvanized steel, aluminum, copper, gold, nickel, magnesium, and alloys thereof, and conductive carbon coated materials. In another embodiment, the substrate can comprise parts which are electrically conductive and parts which are not electrically conductive, for example, a printed circuit board. The at least partially electrically conductive substrate has two major surfaces and edges, and can have a thickness ranging from 25 to 100 microns, typically from 15 to 20 microns. In the case of a multi-layered printed circuit board, the thickness can be much higher. Any printed circuit board known in the art would be suitable for the present invention.

It should be understood that for purposes of the processes of the present invention the formation of vias is intended to encompass the formation of "through vias" (i.e., the formation of holes extending through the substrate from one major surface to the other) to provide through connections, as well as the formation of "blind vias" (i.e., the formation of holes extending through the applied coating only to, but not through, the underlying substrate, or alternatively adjacent previously applied metal layer) to provide electrical connections to, for example, ground or power. Also, for purposes of the present invention, the formation of vias extending "through the substrate" is intended to encompass the formation of through vias only. Likewise, the formation of vias extending "to the substrate" is intended to encompass the formation of blind vias only.

In a particular embodiment of the present invention, the substrate is a metal substrate selected from perforate copper foil, an iron-nickel alloy or combinations thereof. In one embodiment of the present invention, the substrate comprises an iron-nickel alloy commercially available as INVAR (trademark of Imphy S. A., 168 Rue de Rivoli, Paris, France) comprising approximately 64 weight percent iron and 36 weight percent nickel. This alloy has a low coefficient of thermal expansion comparable to that of the silicon materials typically used to prepare chips. This property is desirable in order to prevent failure of adhesive joints between successively larger or smaller scale layers of a chip scale package due to thermal cycling during normal use. When an iron-nickel alloy is used as the metal substrate, a layer of metal, usually copper, typically is applied to all surfaces of the iron-nickel alloy substrate to ensure optimal conductivity. This layer of metal can be applied by conventional means, for example, by electroplating, metal vapor deposition or electroless plating, and typically has a thickness of from 1 to 10 microns.

By "perforate metal core" is meant a mesh sheet having a plurality of holes or vias spaced at regular intervals. The diameter of the holes usually is about 200 microns, but may be larger or smaller as necessary, provided that the diameter is large enough to accommodate all the layers applied in the process of the present invention without the holes becoming obstructed. The center-to-center spacing of the holes typically is about 500 microns, but, likewise, may be larger or smaller as necessary. Via density can range from 500 to 10,000 holes per square inch (77 to 1550 holes per square centimeter).

In another embodiment of the present invention, the substrate is a printed circuit board. The printed circuit board can be any printed circuit board provided it comprises at least one electrically conductive region. The printed circuit board can comprise electrically conductive regions on one or both major surfaces. The printed circuit board optionally comprises through holes or vias.

To the substrate is applied a curable coating composition such as any of the curable coating compositions described below. The coating composition is applied such that a coating is formed over the substrate on all surfaces, including the surfaces within any vias in and/or through the substrate. Obstruction of the vias with the curable coating composition can occur, though not necessary to the present invention. In one embodiment, predetermined areas of the substrate can be masked to prevent the coating from being applied in the masked areas. These areas can be as small as, but typically are larger than vias (i.e., greater than 400 microns) and can be as large as necessary to provide uncoated areas of sufficient size to allow the desired connections in the finished article. By "curable" is meant the composition is uncured and capable of thermosetting within a given temperature range and time specific to the coating composition being used. As used herein, a material that is "thermoset" refers to a material that solidifies or "sets" irreversibly when heated. A thermoset material has formed a crosslinked network. As used herein, a polymeric material is "crosslinked" if it at least partially forms a polymeric network. One skilled in the art will understand that the presence and degree of crosslinking (crosslink density) can be determined by a variety of methods, such as dynamic mechanical thermal analysis (DMTA) using a TA Instruments DMA 2980 analyzer conducted under nitrogen. This method determines the glass transition temperature and crosslink density of free films of coatings or polymers. These physical properties of a cured material are related to the structure of the crosslinked network. Typically the curable coating compositions are stable to thermosetting at temperatures used for normal handling of the article, usually ambient temperature, but capable of thermosetting at elevated temperatures further described below. For the purposes of the present invention, by "uncured" is meant the coating composition maintains a degree of solubility in a liquid, for example, acidic solution, basic solution, or organic solvent. By "basic solution" is meant a solution whose pH is greater than 7. By "acidic solution" in meant a solution whose pH is less than 7.

The curable coating composition can be applied by any of a variety of methods know in the coatings art. Examples of such methods include, but are not limited to electrodeposition, screen printing, curtain coating, roll coating, immersion coating techniques, spray coating, and spin coating. One skilled in the art would recognize that electrodeposition as an application method would be suitable only for substrates which are electrically conductive over substantially the entire surface.

The coating composition applied to the substrate can comprise any of a variety of curable coating compositions known to those skilled in the coatings art, provided that the composition is thermoset curable. In a particular embodiment, the curable coating composition comprises (a) one or more active hydrogen-containing resins, and (b) one or more curing reagents reactive with the active hydrogens of (a). A variety of active hydrogen-containing resin materials are suitable for use in the present invention, provided that the resin has a degree of solubility in acidic solution, basic solution, or organic solvent. Non-limiting examples of such resins include: polyepoxide polymers, acrylic polymers, polyester polymers, urethane polymers, silicon based polymers, polyether polymers, polyurea polymers, vinyl polymers, polyamide polymers, polyimide polymers, mixtures thereof and copolymers thereof. As used herein, by "silicon-based polymers" is meant a polymer comprising one or more —SiO— units in the backbone. Such silicon-based polymers can include hybrid polymers, such as those comprising organic polymeric blocks with one or more —SiO— units in the backbone. The resin may further comprise functional groups to impart solubility in acidic or basic solution, for example ionic groups or groups capable of forming ionic groups. Non-limiting examples of such functional groups include amines, amine salts and carboxylic acids. An example of particularly suitable electrodepositable compositions are halogenated ionic salt group-containing resins as described in U.S. Pat. No. 6,713,587 B2. It should be understood that the resins suitable for use in the coating compositions used in the processes of the present invention typically are not photocurable. As used herein, the term "polymer" is meant to refer to oligomers and both homopolymers and copolymers.

The active hydrogen-containing resin (a) typically is used in conjunction with one or more curing agents (b). Suitable curing agents would be those comprising groups that are reactive with the active hydrogens of resin component (a). Such curing agents include, but are not limited to blocked polyisocyanates, carbodiimides, aziridines, epoxies, aminoplasts, active esters, and mixtures thereof. As used herein, by "active esters" is meant a non-acidic polyester of a polycarboxylic acid having more than one β-hydroxyl ester group per molecule, such as those disclosed in U.S. Pat. Nos. 4,352,842 and 4,332,711.

Mixtures of crosslinking agents (b) may also be used. In one embodiment, two crosslinking agents can be used which cure at different temperatures. One crosslinking agent may impart partial cure at ambient temperature prior to the steps leading to formation of the vias, providing a degree of integrity to the film, but leaving the coating composition soluble in acidic, basic or organic solution. The second crosslinking agent may complete the cure in a separate step at substantially higher temperatures, thus rendering the coating composition intractible.

In one embodiment, the curing agent (b) comprises an aminoplast resin. Suitable aminoplasts are known to those of ordinary skill in the art. Aminoplasts can be obtained from the condensation reaction of an aldehyde with an amine or amide. Nonlimiting examples of amines or amides include melamine, urea, or benzoguanamine. While formaldehyde is used most often, other aldehydes such as acetaldehyde, crotonaldehyde, and benzaldehyde can be used. The aminoplast contains imino and methylol groups and in certain instances at least a portion of the methylol groups are etherified with an alcohol to modify the cure response.

Nonlimiting examples of aminoplasts include melamine-, urea-, or benzoguanamine-formaldehyde condensates, in certain instances monomeric and at least partially etherified with one or more alcohols containing from one to four carbon atoms. Nonlimiting examples of suitable aminoplast resins are commercially available, for example, from Cytec Industries, Inc. under the trademark CYMEL® and from Solutia, Inc. under the trademark RESIMENE®.

In a particular embodiment, the curing agent (b) comprises a blocked polyisocyanate. By "blocked polyisocyanate" is meant that the isocyanate groups have been reacted with a compound such that the resultant blocked isocyanate group is stable to active hydrogens at ambient temperature but reactive with active hydrogens in the resin at elevated temperatures, usually between 90° C. and 200° C. The polyisocyanates can be fully blocked as described in U.S. Pat. No. 3,984,299 column 1 lines 1 to 68, column 2 and column 3 lines 1 to 15, or partially blocked and reacted with the polymer backbone as described in U.S. Pat. No. 3,947,338 column 2 lines 65 to 68, column 3 and column 4 lines 1 to 30, which are incorporated by reference herein.

In one embodiment, the curable coating composition may further comprise a rheology modifier which can assist in preventing the coating from flowing into and obstructing the vias, during the subsequent curing step described below. Any of a variety of the rheology modifiers well-known in the coatings art can be employed for this purpose. Examples of suitable rheology modifiers include solid inorganic fillers in finely divided form such as those described in U.S. Pat. No. 4,601,916, and microgels, for example cationic microgel such as those described in U.S. Pat. No. 5,096,556 and EP 0 272 500 B1.

After application of the curable coating composition, the coated substrate optionally can be heated to a temperature and for a time sufficient to remove any residual water and/or solvent remaining in the coating layer, but insufficient to cure the coating. The temperature to which the coated substrate is heated (which is sufficient to remove volatile liquids from the coating, but insufficient to cure the coating) typically ranges between 100° C. and 130° C. The duration of the heat exposure can depend on the application method and the nature of the volatile substances, and typically ranges between 1 and 10 minutes. The optional drying step may also be accomplished under ambient conditions. As would be recognized by those skilled in the art, these ambient conditions would require longer periods of time to effectively drive off volatile solvents from the coating layer.

A resinous photosensitive layer (i.e. "photoresist" or "resist") is applied over the uncured coating. The resinous photosensitive layer can be a positive or negative photoresist. The photoresist can be applied to part of the uncured coating, but would typically be applied to the entire surface. The photoresist layer can have a thickness ranging from 1 to 50 microns, typically from 5 to 25 microns, and can be applied by any method known to those skilled in the photolithographic processing art. Suitable positive-acting photosensitive resins include any of those known to practitioners skilled in the art. Examples include dinitro-benzyl functional polymers such as those disclosed in U.S. Pat. No. 5,600,035, columns 3–15. Such resins have a high degree of photosensitivity. In one embodiment, the resinous photosensitive layer is a composition comprising a dinitrobenzyl functional polymer, typically applied by roll coating.

Negative-acting photoresists include liquid or dry-film type compositions. Liquid compositions may be applied by rolling, spin coating, screen printing, immersion or curtain techniques. Examples of dry-film photoresists include those disclosed in U.S. Pat. Nos. 3,469,982, 4,378,264, and 4,343,885. Dry-film photoresists are typically laminated onto the surface such as by application of hot rollers. Dry films may be used provided the temperature and time used for lamination is insufficient to cure the film composition.

After the photosensitive layer is applied, a photo-mask having a desired pattern may be placed over the photosensitive layer and the layered substrate exposed to a sufficient level of a suitable radiation source, typically an actinic radiation source (hereafter referred to as "imaging"). As used herein, the term "sufficient level of radiation" refers to that level of radiation which polymerizes the monomers in the radiation-exposed areas in the case of negative acting resists, or which de-polymerizes the polymer or renders the polymer more soluble in the case of positive acting resists. This results in a solubility differential between the radiation-exposed and radiation-shielded areas.

The photo-mask may be removed after exposure to the radiation source and the layered substrate developed using conventional developing solutions to remove more soluble portions of the resist, and expose selected areas of the underlying uncured coating. Typical developers comprise either acidic solutions or basic solutions.

After processing the resist as described above, the exposed portion(s) of the uncured coating are then removed. The portion(s) thus removed can be as small as a via, but can be as large as is necessary to provide an exposed area of sufficient size and shape to allow the desired connections in the finished article. In an embodiment of the present invention, the exposed portions of the uncured coating are removed to form vias in the uncured coating. The vias thus produced can range from 25 to 400 microns, usually 50 to 250 microns, and typically 50 to 200 microns in diameter. The solution used for removal of the uncured coating can be an acidic solution, a basic solution or an organic solvent. The coated substrate can be immersed in the solution used for removal, or sprayed with the solution. In the case where the coated substrate is immersed in the solution used to remove the uncured coating, ultrasonic agitation may be used to ensure adequate mixing of the solution. Coating compositions that can be removed with an acid solution include those polymers comprising basic groups, such as amines. A basic solution can remove coatings comprising acidic groups, such as carboxylic acids.

In one embodiment, the photosensitive layer is developed by applying an acidic solution, and the exposed areas of the uncured coating are removed by the action of a basic solution. In another embodiment, the photosensitive layer is developed by applying a basic solution, and the exposed areas of the uncured coating are removed by the action of an acidic solution. In yet another embodiment, the exposed areas of the uncured coating are capable of being removed by the action of the developer used for the development of the photosensitive layer. In this case, the steps of developing the resist and removing the exposed areas of the uncured coating occur simultaneously. In another embodiment, the exposed areas of the uncured coating are capable of being removed by the action of an organic solvent. Non-limiting examples of suitable solvents include aliphatic, araliphatic and aromatic hydrocarbons and halocarbon, ethers, alcohols, ketones, and esters.

In one embodiment, the removal of the exposed areas of the uncured coating results in one or more openings extending through the coating to the underlying substrate. The area(s) removed may be located upon one or both major surfaces of the coated substrate, and/or may encompass the edge of the coated substrate. In another embodiment, the removal of the exposed areas of the uncured coating results in a pattern of vias through the coating. The vias may extend to the substrate, resulting in blind vias. Additionally, when the exposed area of the uncured coating is aligned with a hole through the substrate, a through via is obtained.

The coated substrate is heated to cure the coating composition. It should be understood that for purposes of this invention, by "cured" is meant the coating is rendered substantially insoluble in the aforementioned acidic, basic or organic solutions by a thermosetting reaction. The temperature and time required to cure the coating composition is dependant on the particular resin (a) and curing agent (b) combination described above. Cure temperatures can range from 60° C. to 220° C., typically 100° C. to 200° C. It should be understood that when the coating is cured, the pattern of vias to or through the substrate remains intact. The cured coating is of substantially uniform thickness except in locations where vias are present. The cured coating is often no more than 50 microns, usually no more than 25 microns, and typically no more than 20 microns in film thickness. In one particular embodiment, the cured coating comprises a dielectric material. By "dielectric material" is meant a substance that is a poor conductor of electricity, but an efficient supporter of electrostatic fields, i.e. an insulator.

The resist protects the underlying uncured coating during the removal of the exposed areas of the uncured coating. The remaining resist, which is impervious to the solutions used for the removal of the exposed areas of the uncured coating described above, may then be removed by a chemical stripping process. In a particular embodiment, the remaining resist is removed before the curing of the underlying coating. In an alternate embodiment, the remaining resist is removed after the underlying coating has been cured. Those skilled in the art would recognize that if the if the exposed areas of the uncured coating are capable of being removed by the action of the same developer used for the development of the resist, the step of curing the underlying coating must be performed before the step of stripping the remaining resist.

In a further embodiment of the present invention, the process can be continued after curing the curable coating and stripping the remaining resist, comprising the subsequent steps of: (h) applying a layer of metal to all surfaces; (i) applying a second resist to the layer of metal applied in step (h); (j) processing the second resist to form a predetermined pattern of exposed underlying metal; (k) etching the exposed metal; and (l) stripping the remaining second resist to form an electrical circuit pattern.

Metallization is performed by applying a layer of metal to all surfaces, allowing for the formation of metallized vias to and/or through the substrate. Suitable metals include copper or any metal,or alloy with sufficient conductive properties. The metal is typically applied by electroplating or any other suitable method known in the art to provide a uniform metal layer. The thickness of this metal layer can range from 1 to 50 microns, typically from 5 to 25 microns.

To enhance the adhesion of the metal layer to the cured coating, prior to the metallization step all surfaces can be treated with ion beam, electron beam, corona discharge or plasma bombardment followed by application of an adhesion promoter layer to all surfaces. The adhesion promoter layer can range from 50 to 5000 Angstroms thick and typically is a metal or metal oxide selected from chromium, titanium, nickel, cobalt, cesium, iron, aluminum, copper, gold, and zinc, and oxides thereof.

After metallization, a second resinous photosensitive layer (i.e. "second photoresist" or "second resist") which can be the same or different from the first resist can be applied to the metal layer. Optionally, prior to application of the photoresist, the metallized substrate can be cleaned and/or pretreated; e.g., treated with an acid etchant to remove oxidized metal. The resinous photosensitive layer can be a positive or negative photoresist as described above, and may be the same as or different from the resist used above. Any of the resists described above are suitable for use as the second resist. In additional embodiments, the resist can be electrodepositable. The photoresist layer can have a thickness ranging from 1 to 50 microns, typically from 5 to 25 microns, and can be applied by any method known to those skilled in the photolithographic processing art. Dry film resists may be used without restriction of laminating temperature and time. Additive or subtractive processing methods may be used to create the desired circuit patterns.

In one embodiment, a positive-acting resist comprises an electrodepositable composition comprising a dinitrobenzyl functional polyurethane and an epoxy-amine polymer such as that described in Examples 3–6 of U.S. Pat. No. 5,600,035.

In another embodiment, a liquid negative-acting resist is applied by electrodeposition, preferable cationic electrodeposition. Electrodepositable photoresist compositions comprise an ionic, polymeric material which may be cationic or anionic, and may be selected from polyesters, polyurethanes, acrylics and polyepoxides. Examples of photoresists applied by anionic electrodeposition are shown in U.S. Pat. No. 3,738,835. Photoresists applied by cationic electrodeposition are described in U.S. Pat. No. 4,592,816.

The second resist is processed as described in detail above (i.e., imaged and developed), to give a pattern of uncovered underlying metal. The metal uncovered may then be etched using metal etchants which convert the metal to water-soluble metal complexes. The soluble complexes may be removed by water spraying.

The second resist protects the underlying metal layer during the etching step. The remaining second resist, which is impervious to the etchants, may then be removed by a chemical stripping process to provide a circuit pattern connected to the substrate by the metallized vias.

After preparation of the circuit pattern on the layered substrate, the process can be repeated from the beginning to form a multi-layered circuit assembly. One skilled in the art would recognize that electrodeposition as an application method would be unsuitable for use in subsequent layers due to the presence of insulating areas between the conductive traces. The curable coating composition may be the same as or different from that applied in previous layers as described above. The resists used in the various steps throughout the process may also be the same as or different from those used in previous steps.

In another embodiment, the present invention is directed to a process for fabricating a multi-layer electrical circuit assembly. The process comprises the steps of (a) applying a curable coating composition, such as the curable coating compositions previously described, to any one of the substrates described above, some or all of which is electrically conductive, to form an uncured coating thereon; (b) applying a resist, for example any of the aforementioned resist compositions, over the uncured coating; (c) imaging the resist in predetermined locations using conditions described above; (d) developing the resist using methods previously described to expose predetermined areas of the uncured coating; (e) using any of the methods described above, removing the exposed areas of the uncured coating to form a via; (f) heating the coated substrate of step (e) to a temperature and for a time sufficient to cure the coating, such as under the above mentioned conditions; (g) stripping the remaining resist as described previously; (h) applying a layer of metal to all surfaces by any of the previously described methods for metallizing; (i) applying any of the aforementioned resist compositions as a second resist to the layer of metal applied in step (h); (j) processing the second resist by art-recognized methods as described above to form a predetermined pattern of exposed underlying metal; (k) etching the exposed metal under conditions described previously; (l) stripping the remaining second resist by art-recognized methods as mentioned above; and (m) optionally repeating steps (a) through (l) one or more times to form multiple layers of interconnecting electrical circuit patterns.

Illustrating the invention are the following examples which are not to be considered as limiting the invention to their details. Unless otherwise indicated, all parts and percentages in the following examples, as well as throughout the specification, are by weight.

EXAMPLES

Preparation of Resinous Binder:

Example A

The following Example describes the preparation of a resinous binder composition used in the electrodepositable paint of Example B. The resinous binders were prepared as described below from the following ingredients.

| Ingredients | Parts by weight (grams) |
| --- | --- |
| Crosslinker[1] | 1882 |
| Diethylene glycol monobutyl ether formal | 108.78 |
| EPON® 828[2] | 755.30 |
| Tetrabromobisphenol A | 694.90 |
| TETRONIC 150R1[3] | 0.33 |
| Diethanolamine | 51.55 |
| Aminopropyl diethanolamine | 113.2 |
| Distillate removed | (67.66) |
| Sulfamic acid | 45.17 |
| Deionized water | 2714 |
| Lactic acid[4] | 1.70 |
| Resin intermediate[5] | 244.7 |
| Gum rosin[5] | 27.49 |
| Deionized water | 2875 |

[1]Polyisocyanate curing agent prepared from the following ingredients:

| Ingredients | Parts by weight (grams) |
| --- | --- |
| Ethanol | 92.0 |
| Propylene glycol | 456.0 |
| Polyol[a] | 739.5 |
| Methylisobutyl ketone | 476.5 |
| Diethylene glycol monobutyl ether formal[b] | 92.8 |
| DESMODUR LS2096[c] | 1320.0 |
| Methylisobutyl ketone | 76.50 |

[a]Bisphenol A/ethylene oxide adduct available from BASF Corporation as MACOL 98B.
[b]Available from BASF Corporation as MAZON 1651.
[c]Isocyanate available from Bayer Corporation.
The first five ingredients were charged to a suitably equipped reaction vessel under agitation. As the temperature reached about 25° C., the addition of DESMODUR LS2096 was begun. Temperature was increased to 105° C. at which time the last addition of methylisobutyl ketone was -continued made. Temperature was held at 100° C. as the reaction was monitored for the disappearance of NCO by infrared spectroscopy at which time, the temperature was reduced to 80° C.
[2]Diglycidyl ether of bisphenol A available from Shell Oil and Chemical Company.
[3]Surfactant available from BASF Corporation.
[4]88% aqueous solution.
[5]Cationic resin prepared from the following ingredients:

| Ingredients | Parts by weight (grams) |
|---|---|
| MAZEEN 355 70[a] | 603.34 |
| Acetic acid | 5.99 |
| Dibutyltindilaurate | 0.66 |
| Toluene diisocyanate | 87.17 |
| Sulfamic acid | 38.79 |
| Deionized water | 1289.89 |

[a]Aminediol available from BASF Corporation.
The first two ingredients were charged to a suitably equipped reaction vessel and agitated for 10 minutes at which time dibutyltindilaurate was added. The toluene diisocyanate was added slowly as the reaction was permitted to exotherm to a temperature of 100° C. and held at that temperature until the disappearance of all NCO as monitored by infrared spectroscopy. The resin thus prepared was solubilized with the addition of sulfamic acid and deionized water under agitation. The final dispersion had a measured resin solids content of 26 percent by weight.

The resinous binder of Example A was prepared generally as follows. The crosslinker was added to a suitably equipped reaction vessel. The next four ingredients were added to the reaction vessel under mild agitation and the reaction mixture was heated to a temperature of 75° C. at which time the diethanolamine was added and the reaction mixture was held at that temperature for a period of 30 minutes. The aminopropyl diethanolamine was then added and the reaction mixture was permitted to exotherm to 132° C. and held at that temperature for a period of 2 hours. Distillate was removed. For solubilization, the reaction product was added under mild agitation to an admixture of the sulfamic acid, deionized water, lactic acid solution and cationic resin intermediate. The gum rosin solution was then added to the solubilized resin, followed by deionized water in two sequential additions. Excess water and solvent were removed by stripping under vacuum at a temperature of 60°–65° C. The final reaction product had a measured resin solids content of approximately 40 percent by weight.

Preparation of Curable Coating Composition:

Example B

The following example describes the preparation of electrodepositable coating compositions in the form of an electrodeposition bath. The composition was prepared as described below from the following ingredients. All values listed represent parts by weight in grams.

| Ingredients | Parts by weight (grams) |
|---|---|
| Resinous binder of Example A | 704.9 |
| Hexyl cellosolve | 28.5 |
| E6278[1] | 13.2 |
| Deionized water | 3053.4 |

[1]Catalyst paste, available from PPG Industries, Inc.

The ingredients were combined and mixed with mild agitation. The composition was ultrafiltered 50% and reconstituted with deionized water.

Preparation of Patterned Substrate Containing Dielectric Coating with Blind Vias

Example 1

Preparation of the Dielectric Coated Substrate

A single layer of 50 micron thick Invar metal perforate containing 200-micron diameter holes positioned 500-microns apart (center to center) in a square grid array, supplied by Buckbee-Mears (a division of BMC Industries, Inc.), was electro-plated with 9 microns of copper. The copper plated Invar perforate was pre-cleaned and micro-etched to remove undesirable dirt, oils and oxides. The metal substrate was then electrophoretically coated with the composition of Example B from a 105° F. (41° C.) coating bath at 90 volts for 2 minutes. The coated article was then rinsed with deionized water and air dried such that all the holes of the perforate were void of water. The coated substrate was then heated to a temperature of at 250° F. (120° C.) for 6 minutes to dry and remove all solvents from the coating.

Blind-Via Formation

The uncured coated substrate was laminated with RISTON® Special FX (available from E. I. Du Pont de Nemours and Company) dry film photoresist. The coated substrate was then exposed with ultraviolet (UV) light through a phototool on each side and developed with a potassium carbonate photoresist developing solution. The substrate was further developed with ELECTROIMAGE® Developer EID-523 (available from PPG Industries, Inc.) photoresist developing solution to remove the exposed areas of the uncured coating thus forming blind-vias in the coating layer. The dry film photoresist was removed with a potassium hydroxide stripping solution and the substrate heated in an oven at 350° F. (177° C.) for 30 minutes to facilitate crosslinking of the polymer coating, yielding a dry film thickness of 20 microns with 100 micron diameter blind-vias formed where needed.

Metallization of the Substrate

The coated perforate metal core was heated in an oven at 50° C. for 30 minutes to remove trace amounts of moisture that may have been absorbed during handling. The substrate was then immediately introduced into a vacuum chamber where it was plasma treated with argon ions to activate the coating surface. After plasma treatment, 200 angstroms of nickel was sputter coated onto the surface followed by 3000 angstroms of sputter coated copper. The metal layer was increased by electro-plating 9 additional microns of copper.

Patterning of the Substrate

The metallized substrate was pre-cleaned and micro-etched to remove undesirable dirt, oils and oxides. The metal substrate was then electrophoretically coated with ELECTROIMAGE® Plus photoresist (available from PPG Industries, Inc.) from an 84° F. (29° C.) coating bath at 80 volts for 90 seconds. The coated article was then rinsed with deionized water and heated in an oven at 250° F. (120° C.) for 6 minutes to dry and remove all solvents from the photoresist coating to give a dry film thickness of 5 microns. The coated board was then exposed with ultraviolet (UV) light through a phototool on each side and developed with ELECTROIMAGE® Developer EID-523 photoresist developing solution. The exposed copper areas were etched with a cupric chloride acid etchant and the remaining photoresist stripped with ELECTROIMAGE® Stripper EID-568 photoresist stripping solution (available from PPG Industries, Inc.), giving the circuitized article.

Preparation of Patterned Substrate Containing Dielectric Coating with Blind Vias, Comprising Curing Coating Before Stripping Resist

Example 2

The substrate was prepared and coated as in Example 1 above. After removing the exposed areas of uncured coating, the coated substrate was heated in an oven at 350° F. (177° C.) for 30 minutes to facilitate crosslinking of the polymer coating. The dry film photoresist was then removed with a potassium hydroxide stripping solution, giving a 20 micron thick dielectric layer with 100 micron diameter blind-vias where needed. The cured coated substrate was metallized and patterned as described above in Example 1 to give a circuitized article.

It will be appreciated by those skilled in the art that changes could be made to the embodiments described above without departing from the broad inventive concept thereof. It is understood, therefore, that this invention is not limited to the particular embodiments disclosed, but it is intended to cover modifications which are within the spirit and scope of the invention, as defined by the appended claims.

What is claimed is:

1. A process for exposing predetermined areas of a substrate comprising the following steps:
   (a) applying a curable coating composition to a substrate, some or all of which is electrically conductive, to form an uncured coating thereon;
   (b) applying a resist over said uncured coating;
   (c) imaging said resist in predetermined locations;
   (d) developing said resist to expose predetermined areas of the uncured coating;
   (e) removing the exposed areas of the uncured coating; and
   (f) heating the coated substrate of step (e) to a temperature and for a time sufficient to cure the coating.

2. The process of claim 1 wherein the exposed areas of the uncured coating are removed in step (e) to form one or more vias.

3. The process of claim 1 wherein upon completion of step (a) the coated substrate is heated to a temperature and for a time sufficient to remove any solvent and/or water from said uncured coating, but insufficient to cure the coating.

4. The process of claim 1 wherein the substrate is metal.

5. The process of claim 4 wherein the metal substrate is a perforate metal core.

6. The process of claim 5 wherein the metal core is selected from perforate copper foil, nickel-iron alloys, and combinations thereof.

7. The process of claim 6 wherein the metal core is a nickel-iron alloy.

8. The process of claim 6 wherein before the application of the curable coating composition in step (a), a layer of copper metal is applied to the metal core.

9. The process of claim 1 wherein the substrate is a printed circuit board.

10. The process of claim 1, further comprising the following step:
    (g) stripping the remaining resist.

11. The process of claim 10 wherein step (f) is performed prior to step (g).

12. The process of claim 10 wherein step (g) is performed prior to step (f).

13. The process of claim 10, further comprising the following subsequent steps:
    (h) applying a layer of metal to all surfaces;
    (i) applying a second resist to the layer of metal applied in step (h);
    (j) processing said second resist to form a predetermined pattern of exposed underlying metal;
    (k) etching said exposed metal; and
    (l) stripping the remaining second resist to form an electrical circuit pattern.

14. The process of claim 13 wherein the layer of metal applied in step (h) comprises copper.

15. The process of claim 13 wherein upon completion of step (l), steps (a) through (l) of said process are repeated one or more times to form multiple layers of interconnecting electrical circuit patterns.

16. The process of claim 10 wherein step (f) is performed prior to step (g).

17. The process of claim 10 wherein step (g) is performed prior to step (f).

18. The process of claim 1 wherein the curable coating composition is applied by electrodeposition.

19. The process of claim 1 wherein the curable coating composition is applied by screen printing.

20. The process of claim 1 wherein the curable coating composition is applied by curtain coating.

21. The process of claim 1 wherein the curable coating composition is applied by roll coating.

22. The process of claim 1 wherein the curable coating composition is applied by immersion coating techniques.

23. The process of claim 1 wherein the curable coating composition is spray-applied.

24. The process of claim 1 wherein the curable coating composition is applied by spin coating.

25. The process of claim 1 wherein said curable coating composition comprises:
    (a) one or more active hydrogen-containing resins; and
    (b) one or more curing reagents reactive with the active hydrogens of (a).

26. The process of claim 25 wherein said active hydrogen-containing resin comprises at least one polymer selected from a polyepoxide polymer, an acrylic polymer, a polyester polymer, a urethane polymer, a silicon based polymer, a polyether polymer, a polyurea polymer, a vinyl polymer, a polyamide polymer, a polyimide polymer, mixtures thereof and copolymers thereof.

27. The process of claim 25 wherein said curing agent (b) is selected from blocked polyisocyanates, carbodiimides, aziridines, epoxies, aminoplasts, active esters, and mixtures thereof.

28. The process of claim 1 wherein steps (d) and (e) occur simultaneously.

29. The process of claim 1 wherein the resist is removed in step (d) by applying an acidic solution, and the curable coating is removed in step (e) by applying a basic solution.

30. The process of claim 1 wherein the resist is removed in step (d) by applying a basic solution, and the curable coating is removed in step (e) by applying an acidic solution.

31. The process of claim 1 wherein the curable coating is removed in step (e) by applying an organic solvent.

32. The process of claim 1 wherein the cured coating composition comprises a dielectric material.

33. A process for fabricating a multi-layer electrical circuit assembly comprising the following steps:
    (a) applying a curable coating composition to a substrate, some or all of which is electrically conductive, to form an uncured coating thereon;
    (b) applying a resist over said uncured coating;
    (c) imaging said resist in predetermined locations;
    (d) developing said resist to expose predetermined areas of the uncured coating;
    (e) removing the exposed areas of the uncured coating to form a via;
    (f) heating the coated substrate of step (e) to a temperature and for a time sufficient to cure the coating;
    (g) stripping the remaining resist;

(h) applying a layer of metal to all surfaces;

(i) applying a second resist to the layer of metal applied in step (h);

(j) processing said second resist to form a predetermined pattern of exposed underlying metal;

(k) etching said exposed metal;

(l) stripping the remaining second resist; and (m) optionally repeating steps (a) through (l) one or more times to form multiple layers of interconnecting electrical circuit patterns.

34. The process of claim 33 wherein the exposed areas of the uncured coating are removed in step (e) to form one or more vias.

35. The process of claim 33 wherein upon completion of step (a) the coated substrate is heated to a temperature and for a time sufficient to remove any solvent and/or water from said uncured coating, but insufficient to cure the coating.

36. The process of claim 33 wherein the substrate is metal.

37. The process of claim 36 wherein the metal substrate is a perforate metal core.

38. The process of claim 37 wherein the metal core is selected from perforate copper foil, nickel-iron alloys, and combinations thereof.

39. The process of claim 38 wherein the metal core is a nickel-iron alloy.

40. The process of claim 37 wherein before the application of the curable coating composition in step (a), a layer of copper metal is applied to the metal core.

41. The process of claim 33 wherein the substrate is a printed circuit board.

42. The process of claim 33 wherein the curable coating composition is applied by electrodeposition.

43. The process of claim 33 wherein the curable coating composition is applied by screen printing.

44. The process of claim 33 wherein the curable coating composition is applied by curtain coating.

45. The process of claim 33 wherein the curable coating composition is applied by roll coating.

46. The process of claim 33 wherein the curable coating composition is applied by immersion coating techniques.

47. The process of claim 33 wherein the curable coating composition is spray-applied.

48. The process of claim 33 wherein the curable coating composition is applied by spin coating.

49. The process of claim 33 wherein said curable coating composition comprises:

(a) one or more active hydrogen-containing resins; and (b) one or more curing reagents reactive with the active hydrogens of (a).

50. The process of claim 49 wherein said active hydrogen-containing resin comprises at least one polymer selected from a polyepoxide polymer, an acrylic polymer, a polyester polymer, a urethane polymer, a silicon based polymer, a polyether polymer, a polyurea polymer, a polyurea polymer, a vinyl polymer, a polyamide polymer, a polyimide polymer, mixtures thereof and copolymers thereof.

51. The process of claim 49 wherein said curing agent (b) is selected from blocked polyisocyanates, carbodiimides, aziridines, epoxies, aminoplasts, active esters, and mixtures thereof.

52. The process of claim 33 wherein steps (d) and (e) occur simultaneously.

53. The process of claim 33 wherein the resist is removed in step (d) by applying an acidic solution, and the curable coating is removed in step (e) by applying a basic solution.

54. The process of claim 33 wherein the resist is removed in step (d) by applying a basic solution, and the curable coating is removed in step (e) by applying an acidic solution.

55. The process of claim 33 wherein the curable coating is removed in step (e) by applying an organic solvent.

56. The process of claim 33 wherein the cured coating composition comprises a dielectric material.

57. The process of claim 33 wherein the layer of metal applied in step (h) comprises copper.

* * * * *

US006951707C1

(12) EX PARTE REEXAMINATION CERTIFICATE (7421st)
United States Patent
Wang et al.

(10) Number: US 6,951,707 C1
(45) Certificate Issued: Mar. 23, 2010

(54) PROCESS FOR CREATING VIAS FOR CIRCUIT ASSEMBLIES

(75) Inventors: Alan E. Wang, Gibsonia, PA (US); Kevin C. Olson, Wexford, PA (US)

(73) Assignee: PPG Industries Ohio, Inc., Cleveland, OH (US)

Reexamination Request:
No. 90/009,046, May 6, 2008

Reexamination Certificate for:
Patent No.: 6,951,707
Issued: Oct. 4, 2005
Appl. No.: 10/184,387
Filed: Jun. 27, 2002

Related U.S. Application Data

(63) Continuation-in-part of application No. 09/901,373, filed on Jul. 9, 2001, now Pat. No. 6,671,950, and a continuation-in-part of application No. 09/851,904, filed on May 9, 2001, now abandoned, and a continuation-in-part of application No. 09/802,001, filed on Mar. 8, 2001, now abandoned.

(51) Int. Cl.
*H05K 3/00* (2006.01)
*H05K 3/46* (2006.01)
*H05K 3/44* (2006.01)
*H05K 1/05* (2006.01)

(52) U.S. Cl. .................................... 430/313; 430/330
(58) Field of Classification Search ................. None
See application file for complete search history.

(56) References Cited

U.S. PATENT DOCUMENTS

| 4,861,438 A | * | 8/1989 | Banks et al. ................. 205/125 |
| 5,134,056 A | | 7/1992 | Schmidt et al. |
| 5,362,359 A | | 11/1994 | Horikoshi et al. |
| 5,601,905 A | | 2/1997 | Watanabe et al. |
| 6,303,230 B1 | | 10/2001 | Watanabe et al. |

FOREIGN PATENT DOCUMENTS

| FR | 2041471 | 1/1971 |
| JP | 06268378 A | 9/1994 |
| JP | 11145205 A | 5/1999 |

OTHER PUBLICATIONS

Patent Abstracts of Japan, vol. 018, No. 673 (E–1647), Dec. 19, 1994 & JP 06 268378 A (Oki Electric Ind. Co. Ltd.), Sep. 22, 1994.
Patent Abstracts of Japan, vol. 1999, No. 10, Aug. 31, 1999 & JP 11 145205 A (Hitachi Cable Ltd.), May 28, 1999.

* cited by examiner

*Primary Examiner*—Stephen J Stein

(57) ABSTRACT

Provided is a process for creating vias for a circuit assembly including the steps of (a) applying a curable coating composition to a substrate, some or all of which is electrically conductive, to form an uncured coating thereon; (b) applying a resist over the uncured coating; (c) imaging the resist in predetermined locations; (d) developing the resist to expose predetermined areas of the uncured coating; (e) removing the exposed areas of the uncured coating; and (f heating the coated substrate of step (e) to a temperature and for a time sufficient to cure the coating. Also disclosed is a process of fabricating a circuit assembly.

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1 and 33 are cancelled.

Claims 2–32 and 34–57 were not reexamined.

\* \* \* \* \*